United States Patent
Hori et al.

(10) Patent No.: US 8,551,804 B2
(45) Date of Patent: Oct. 8, 2013

(54) METHOD OF MANUFACTURING OPTICAL COMPONENT, OPTICAL COMPONENT, METHOD OF MANUFACTURING DISPLAY DEVICE, AND DISPLAY DEVICE

(75) Inventors: Kazuhito Hori, Kanagawa (JP); Akira Ono, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 13/120,999

(22) PCT Filed: Sep. 17, 2009

(86) PCT No.: PCT/JP2009/066232
§ 371 (c)(1),
(2), (4) Date: Mar. 25, 2011

(87) PCT Pub. No.: WO2010/035678
PCT Pub. Date: Apr. 1, 2010

(65) Prior Publication Data
US 2011/0175118 A1    Jul. 21, 2011

(30) Foreign Application Priority Data
Sep. 25, 2008   (JP) .................................. 2008-246416

(51) Int. Cl.
*H01L 21/00*   (2006.01)
(52) U.S. Cl.
USPC .......................................................... 438/69
(58) Field of Classification Search
None
See application file for complete search history.

(56) References Cited

U.S. PATENT DOCUMENTS

| | | | |
|---|---|---|---|
| 5,457,006 A * | 10/1995 | Hirokane et al. | 430/323 |
| 5,684,553 A * | 11/1997 | Fukuchi | 349/110 |
| 7,385,911 B2 * | 6/2008 | Yoshitoku et al. | 369/275.4 |
| 7,692,129 B2 * | 4/2010 | Toshikiyo et al. | 250/208.1 |
| 2004/0063037 A1 * | 4/2004 | Hasegawa et al. | 430/311 |
| 2006/0061708 A1 | 3/2006 | Umebayashi et al. | |
| 2006/0098281 A1 * | 5/2006 | Fukushima et al. | 359/464 |
| 2006/0115983 A1 * | 6/2006 | Fujii et al. | 438/640 |
| 2007/0046862 A1 | 3/2007 | Umebayashi et al. | |
| 2007/0216827 A1 | 9/2007 | Okada et al. | |
| 2009/0026943 A1 * | 1/2009 | Yuki | 313/505 |

FOREIGN PATENT DOCUMENTS

| | | |
|---|---|---|
| JP | 2002-49326 | 2/2002 |
| JP | 2003-203762 | 7/2003 |
| JP | 2003-264059 | 9/2003 |
| JP | 2005-164902 | 6/2005 |
| JP | 2005-227519 | 8/2005 |
| JP | 2005-275142 | 10/2005 |
| JP | 2006-323328 | 11/2006 |
| JP | 2007-183363 | 7/2007 |
| JP | 2007-248484 | 9/2007 |

* cited by examiner

Primary Examiner — Charles Garber
Assistant Examiner — Andre' C Stevenson
(74) Attorney, Agent, or Firm — K&L Gates, LLP

(57) ABSTRACT

A method and optical component prevent external light reflection and increase light extraction efficiency. In one example embodiment, an optical component is provided on a light extraction side of a light-emitting panel. After a shielding film shaped like a lattice or a mesh is formed on a transparent substrate, a resist film is formed, the resist film is irradiated with ultraviolet light UV from the back side of the substrate by using the shielding film as a mask, and development is carried out, so that an optical functional element is formed. The planar shape of the undersurface of the optical functional element is the same as the planar shape of the lattice or the mesh of the shielding film, and a positioning error between the optical functional element and the shielding film becomes extremely small.

13 Claims, 16 Drawing Sheets

METHOD OF MANUFACTURING OPTICAL COMPONENT, OPTICAL COMPONENT, METHOD OF MANUFACTURING DISPLAY DEVICE, AND DISPLAY DEVICE

CROSS REFERENCE TO RELATED APPLICATIONS

The present application is a National Stage of International Application No. PCT/JP2009/066232 filed on Sep. 17, 2009, which claims priority to Japanese Patent Application No. 2008-246416 filed on Sep. 25, 2008, the entire contents of which are being incorporated herein by reference.

BACKGROUND

A self-light-emitting element such as an organic light-emitting element has a first electrode, a layer including a light-emitting layer and a second electrode sequentially on a board, and produces light when recombination of hole and electron takes place in the light-emitting layer with the application of a DC voltage between the first electrode and the second electrode. There is a case in which the produced light is taken out from the side where the first electrode and the board are provided, but also, there is a case in which the produced light is taken out from the side where the second electrode is provided, namely, from the side opposite to a circuit including TFT (Thin Film Transistor) and wiring, in order to increase an aperture ratio.

As an example of display devices using the self-light-emitting element, there is a light-emitting device using the organic light-emitting element (for example, refer to PTL 1). Further, a method of preventing external-light reflection by disposing a color filter and a shielding film serving as a black matrix (for example, see PLT 2) has been proposed.

However, in these display devices in the past, the light produced in the light-emitting layer is not taken out from the inside of the device due to total reflection and the like, and it cannot be said that light utilization efficiency is excellent.

Therefore, it has been suggested to dispose an optical component called a reflecting board (a reflector) directly above the organic light-emitting element, thereby improving light extraction efficiency (for example, see PLT 3). In this optical component, two or more optical functional elements shaped like a protrusion are disposed on a substrate such as glass, and a reflecting mirror film is formed on the side of the optical functional elements.

CITATION LIST

Patent Literature

PTL 1: Japanese Unexamined Patent Application Publication No. 2005-227519
PTL 2: Japanese Unexamined Patent Application Publication No. 2003-203762
PTL 3: Japanese Unexamined Patent Application Publication No. 2007-248484

SUMMARY

The present disclosure relates to a method of manufacturing an optical component having an optical function such as reflection and diffusion, and the optical component, as well as a method of manufacturing a display device and the display device.

Such an optical functional element is a microstructure of about 50 μm to 150 μm in each of diameter and height, and a slight change of its shape greatly altered the reflection and deflection performance. Further, a positioning error with respect to the organic light-emitting element also had affected the light extraction performance. In particular, when disposing such an optical functional element in the display device considering the prevention of the external-light reflection, it was extremely difficult to carry out alignment with the color filter or the shielding film. Therefore, it was desired to establish a production technique capable of producing the optical functional element with high precision.

The present disclosure has been made in view of the foregoing problems, and aims to provide a method of manufacturing an optical component and the optical component, as well as a method of manufacturing a display device and the display device, which can prevent the external light reflection and increase the light extraction efficiency.

A first method of manufacturing an optical component according to an example embodiment of the present disclosure includes the following steps (A) to (D).

(A) A step of forming, on a surface of a transparent substrate, a shielding film shaped like a lattice or a mesh.
(B) A step of forming a resist film all over the surface of the substrate.
(C) A step of irradiating the resist film with ultraviolet light from a back side of the substrate by using the shielding film as a mask.
(D) A step of forming an optical functional element in the lattice or the mesh of the shielding film by developing the resist film.

An optical component according to an example embodiment of the present disclosure includes: a transparent substrate; a shielding film formed on a surface of the substrate and shaped like a lattice or a mesh; an optical functional element formed in the lattice or the mesh of the shielding film, and having an undersurface whose planar shape is identical to a planar shape of the lattice or the mesh of the shielding film; and a color filter formed on a top surface of the optical functional element.

A first method of manufacturing a display device according to an example embodiment of the present disclosure includes: a step of forming a light-emitting panel having plural self-light-emitting elements on a substrate; a step of forming an optical component; and a step of providing the optical component on a light extraction side of the light-emitting panel, and the step of forming the optical component includes the steps (A) to (D) of the above-described first method of manufacturing the optical component.

A display device according to an example embodiment of the present disclosure includes: a light-emitting panel having plural self-light-emitting elements on a substrate; and an optical component provided on a light extraction side of the light-emitting panel, and the optical component constitutes the above-described optical component.

A second method of manufacturing an optical component according to an example embodiment of the present disclosure includes the following steps (A) to (D).

(A) A step of forming, after a shielding film shaped like a lattice or a mesh is formed on a surface of a transparent substrate, a color filter in the lattice or the mesh of the shielding film.
(B) A step of forming a resist film all over the surface of the substrate.
(C) A step of irradiating the resist film with ultraviolet light from a front side of the substrate via a mask.

(D) A step of forming an optical functional element on the color filter by developing the resist film.

A second method of manufacturing a display device according to an example embodiment of the present disclosure includes: a step of forming a light-emitting panel having plural self-light-emitting elements on a substrate; a step of forming an optical component; and a step of providing the optical component on a light extraction side of the light-emitting panel, and the step of forming the optical component includes the steps (A) to (D) of the above-described second method of manufacturing the optical component.

In the optical component of the present disclosure, while external light or reflected light of the external light is absorbed by the shielding film, the traveling direction of the light and the reflection are controlled by the optical functional element formed in the lattice or the mesh of the shielding film.

According to the first method of manufacturing the optical component of the present disclosure or the first method of manufacturing the display device of the present disclosure, the resist film is irradiated with the ultraviolet light from the back side of the substrate by using the shielding film as the mask and thus, a positioning error between the optical functional element and the shielding film can be made extremely small.

According to the optical component of the present disclosure, the optical functional element is formed in the lattice or the mesh of the shielding film, and the planar shape of the undersurface of this optical functional element is made to be equal to the planar shape of the lattice or the mesh of the shielding film and thus, the positioning error between the optical functional element and the shielding film can be made extremely small. Therefore, by configuring the display device by using this optical component, it is possible to prevent external-light reflection by the shielding film, increase positional accuracy between the optical functional element and the self-light-emitting elements, and improve the light extraction efficiency.

According to the second method of manufacturing the optical component of the present disclosure or the second method of manufacturing the display device of the present disclosure, the resist film is formed on the substrate where the shielding film and the color filter are formed, this resist film is irradiated with the ultraviolet light via the mask, and the optical functional element is formed on the color filter by development and thus, a positioning accuracy between the optical functional element and the shielding film as well as the color filter can be increased.

DETAILED DESCRIPTION

Example embodiments of the present disclosure will be described below in detail with reference to the drawings.

First Example Embodiment

Figure 1:
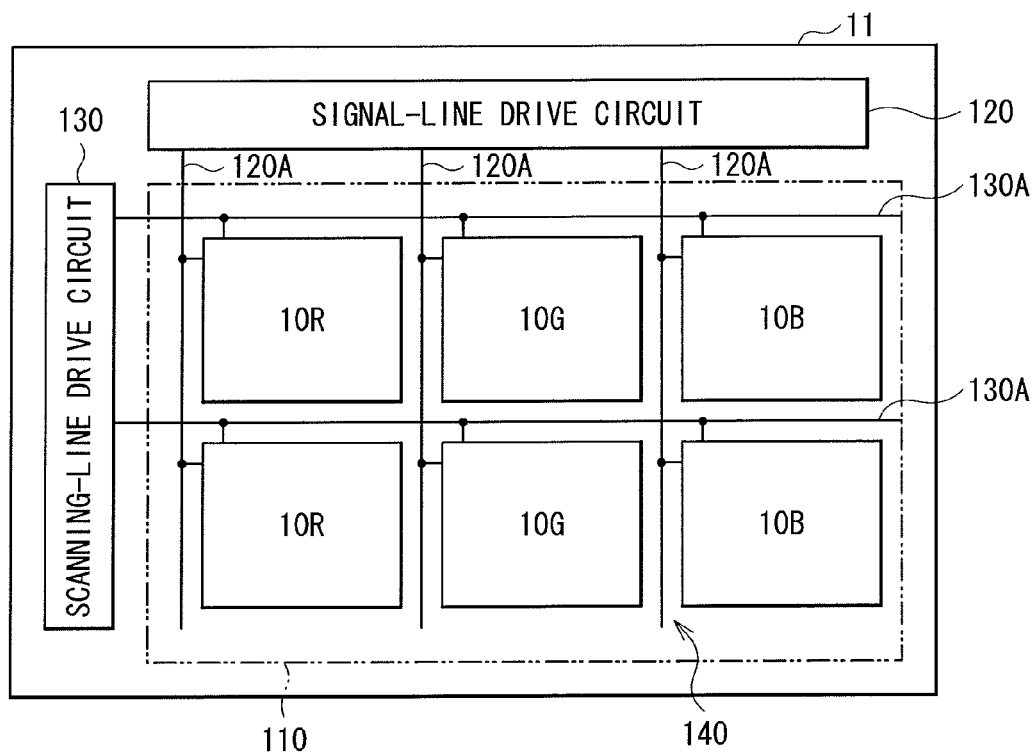
FIG. 1 is a diagram illustrating a configuration of a display device according to a first example embodiment of the present disclosure.

FIG. 1 illustrates a configuration of a display device according to a first example embodiment of the present disclosure. This display device is used as an extra-thin type of organic light-emission color display device or the like, and is, for example, a device in which, on a drive board 11 made of, for example, glass, silicon (Si) wafer, resin or the like, a display region 110 where plural organic light-emitting elements 10R, 10G and 10B to be described later are arranged in a matrix is formed, and a signal-line drive circuit 120 serving as a driver for image display and a scanning-line drive circuit 130 are formed around this display region 110.

Figure 2:
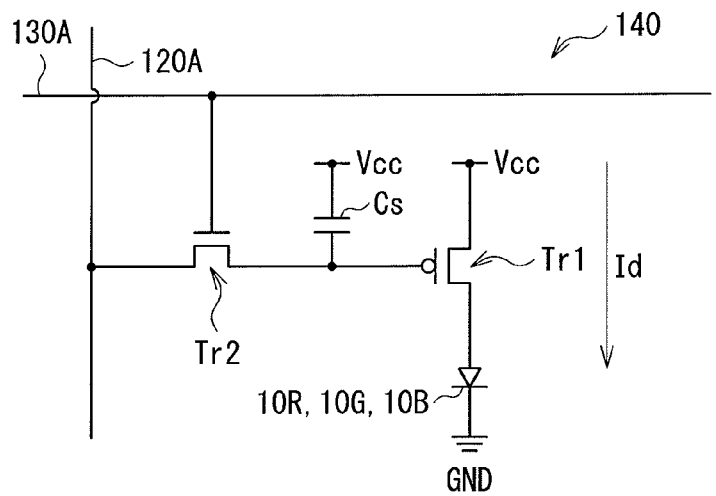
FIG. 2 is an equivalent circuit diagram illustrating an example of a pixel drive circuit illustrated in FIG. 1.

A pixel drive circuit 140 is formed within the display region 110. FIG. 2 illustrates an example of the pixel drive circuit 140. This pixel drive circuit 140 is formed in a layer below a first electrode 13 to be described later, and is an active type of drive circuit having: a drive transistor Tr1 and a write transistor Tr2; a capacitor (retention capacity) Cs therebetween; and the organic light-emitting element 10R (or 10G, 10B) connected to the drive transistor Tr1 in series between a first power supply line (Vcc) and a second power supply line (GND). The drive transistor Tr1 and the write transistor Tr2 are each made up of a general thin-film transistor (TFT (Thin Film Transistor)) and the structure may be, for example, a reversed staggered structure (the so-called bottom gate type) or a staggered structure (the so-called top gate type) and is not limited in particular.

In the pixel drive circuit 140, plural signal lines 120A are arranged in a column direction and plural scanning lines 130A are arranged in a row direction. An intersection of each signal line 120A and each scanning line 130A corresponds to any one (sub-pixel) of the organic light-emitting elements 10R, 10G and 10B. Each signal line 120A is connected to the signal-line drive circuit 120, and image signals are supplied to the source electrode of the write transistor Tr2 through the signal lines 120A from this signal-line drive circuit 120. Each scanning line 130A is connected to the scanning-line drive circuit 130, and scanning signals are sequentially supplied to the gate electrode of the write transistor Tr2 through the scanning lines 130A from this scanning-line drive circuit 130.

Figure 3:
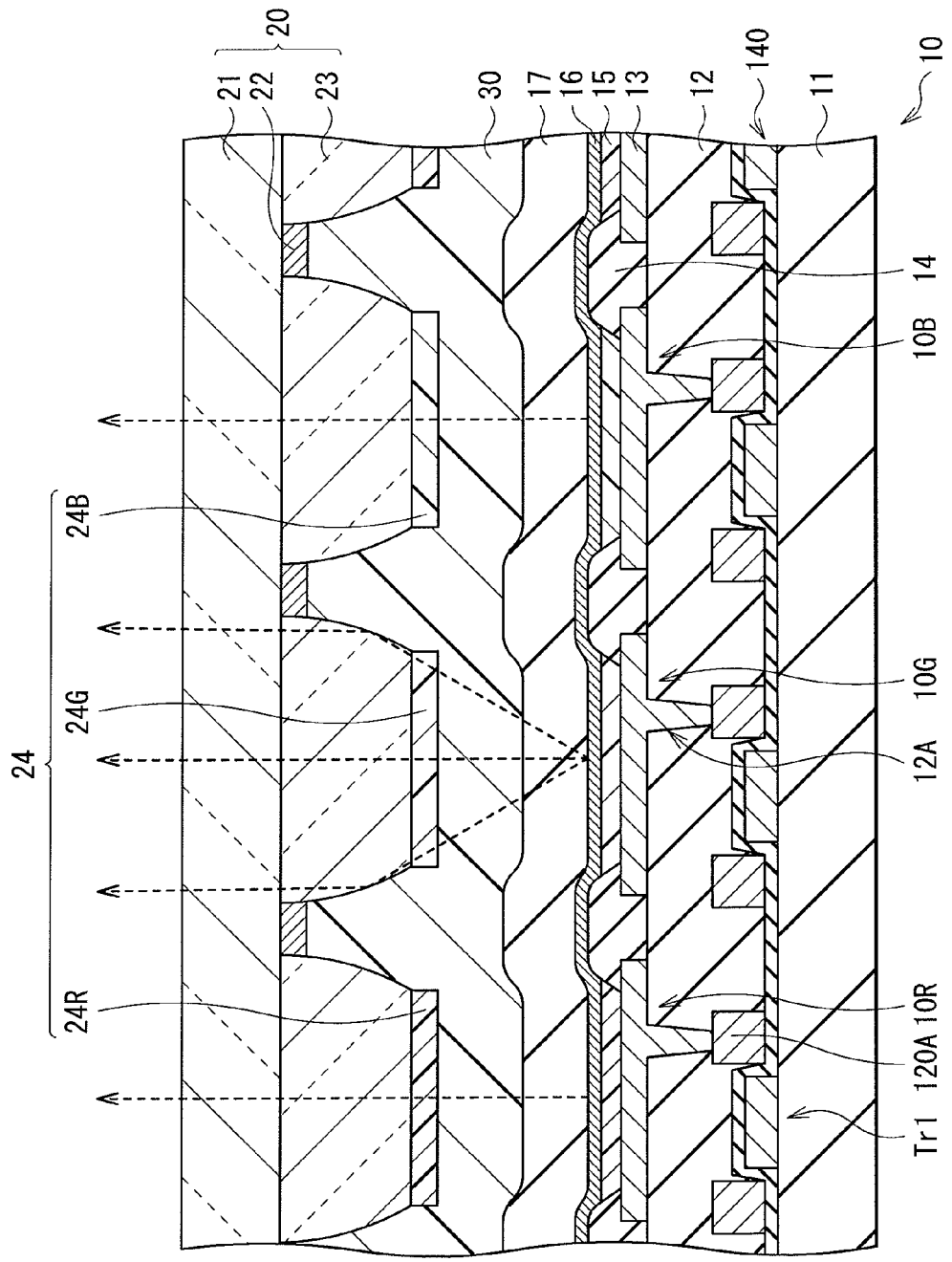
FIG. 3 is a cross-sectional view illustrating a configuration of a display region of the display device illustrated in FIG. 1.

FIG. 3 illustrates a cross-sectional configuration in the display region 110 of the display device illustrated in FIG. 1. This display device has an optical component 20, on the light extraction side of a light-emitting panel 10. The light-emitting panel 10 and the optical component 20 are affixed to each other by an adhesive layer 30 such as thermosetting resin or ultraviolet curing resin.

The light-emitting panel 10 is a panel in which, on the drive board 11, the organic light-emitting element 10R that emits red light, the organic light-emitting element 10G that emits green light, and the organic light-emitting element 10B that emits blue light are sequentially formed, in a matrix as a whole. Incidentally, the organic light-emitting elements 10R, 10G and 10B each have a rectangular planar shape, and a combination of the adjacent organic light-emitting elements 10R, 10G and 10B forms one picture element (pixel).

Each of the organic light-emitting elements 10R, 10G and 10B has such a structure that from the drive board 11 side, via the pixel driving circuit 140 and a planarizing layer 12, a first electrode 13 serving as an anode, an insulating film 14, an organic layer 15 including a light-emitting layer to be described later, and a second electrode 16 serving as a cathode are laminated in this order, and is covered with a protective film 17 as needed.

The planarizing layer 12 flattens the surface of the drive board 11 on which the pixel driving circuit 140 is formed, and is a base layer to make the film thickness of each of the organic light-emitting elements 10R, 10G and 10B uniform. The planarizing layer 12 is provided with a connection aperture 12A that connects the first electrode 13 of each of the organic light-emitting elements 10R, 10G and 10B to the signal line 120A. Since the connection aperture 12A that is minute is formed, it is preferable that the planarizing layer 12 be made of a material with excellent pattern precision. The planarizing layer 12 is made of photosensitive resin such as polyimide, polybenzoxazole, acrylic or Novolak.

The first electrode 13 is formed for each of the organic light-emitting elements 10R, 10G and 10B, and the first electrodes 13 are electrically separated by the insulating film 14. In addition, the first electrode 13 has a function as a reflecting electrode that reflects the light produced in the light-emitting layer, and is desired to have as high a reflectance as possible so as to increase light-emitting efficiency. For example, the first electrode 13 is 100 nm or more and 1,000 nm or less in thickness, and made of aluminum (Al) or an alloy including aluminum (Al), or silver (Ag) or an alloy including silver (Ag). Further, the first electrode 13 may be made of a simple substance or an alloy of a metallic element such as chromic (Cr), titanium (Ti), iron (Fe), cobalt (Co), nickel (Ni), molybdenum (Mo), copper (Cu), tantalum (Ta), tungsten (W), platinum (Pt), or gold (Au)

The insulating film 14 is intended to ensure an insulation property between the first electrode 13 and the second electrode 16 and make the light emitting region to be in a desired shape precisely, and is made of, for example, an organic material such as photosensitive acrylic, polyimide and polybenzoxazole, or an inorganic insulating material such as silicon oxide ($SiO_2$). The insulating film 14 has an opening section corresponding to the light emitting region of the first electrode 13. Incidentally, the organic layer 15 and the second electrode 16 may be continuously provided not only on the light emitting region but also on the insulating film 14, but light emission occurs only in the opening section of the insulating film 14.

The organic layer 15 has, for example, such a structure that from the first electrode 13 side sequentially, a hole injection layer, a hole transport layer, the light-emitting layer and an electron transport layer are laminated, and among these, the layers other than the light-emitting layer may be provided as needed. In addition, the organic layers 15 may vary in structure by the color of light emission of the organic light-emitting elements 10R, 10G and 10B. The hole injection layer is intended to increase hole injection efficiency, and is a buffer layer to prevent leakage. The hole transport layer is intended to increase hole transport efficiency to the light-emitting layer. The light-emitting layer emits the light when recombination of electron and positive hole takes place with the application of an electric field. The electron transport layer is intended to increase electron transport efficiency to the light-emitting layer. Incidentally, between the electron transport layer and the second electrode 16, an electron injection layer (not illustrated) made of LiF, $Li_2O$ or the like may be provided.

As a material of the hole injection layer of the organic light-emitting element 10R, there is, for example, 4,4',4"-tris (3-methylphenylphenylamino)triphenylamine (m-MT-DATA) or 4,4',4"-tris(2-naphthylphenylamino)triphenylamine (2-TNATA). As a material of the hole transport layer of the organic light-emitting element 10R, there is, for example, bis[(N-naphthyl)-N-phenyl]benzidine (a-NPD). As a material of the light-emitting layer of the organic light-emitting element 10R, there is, for example, 8-quinolinol aluminum complexes ($Alq_3$) mixed with 40 vol % of 2,6-bis [4-[N-(4-methoxyphenyl)-N-phenyl]amino styryl]naphthalene-1,5-dicarbonitrile (BSN-BCN). As a material of the electron transport layer of the organic light-emitting element 10R, there is, for example, $Alq_3$.

As a material of the hole injection layer of the organic light-emitting element 10G, there is, for example, m-MT-DATA or 2-TNATA. As a material of the hole transport layer of the organic light-emitting element 10G, there is, for example, α-NPD.

As a material of the light-emitting layer of the organic light-emitting element 10G, there is, for example, $Alq_3$ mixed with 3 vol % of coumarin 6. As a material of the electron transport layer of the organic light-emitting element 10G, there is, for example, $Alq_3$.

As a material of the hole injection layer of the organic light-emitting element 10B, there is, for example, m-MT-DATA or 2-TNATA. As a material of the hole transport layer of the organic light-emitting element 10B, there is, for example, α-NPD. As a material of the light-emitting layer of the organic light-emitting element 10B, there is, for example, spiro 6Φ. As a material of the electron transport layer of the organic light-emitting element 10B, there is, for example, $Alq_3$.

The second electrode 16 has a thickness of, for example, 5 nm or more and 50 nm or less, and is made of a simple substance or an alloy of a metallic element such as aluminum (Al), magnesium (Mg), calcium (Ca) and sodium (Na). Above all, an alloy (MgAg alloy) of magnesium and silver, or an alloy (AlLi alloy) of aluminum (Al) and lithium (Li) is preferable. In addition, the second electrode 16 may be made of ITO (Indium Tin Oxide) or IZO (Indium Zinc Oxide).

The protective film 17 has a thickness of, for example, 500 nm or more and 10,000 nm or less, and is made of silicon oxide ($SiO_2$), silicon nitride (SiN), etc.

The optical component 20 is provided on the light extraction side of the light-emitting panel 10, namely, the second electrode 16 side, and has the function as the reflecting board (reflector) that increases the light extraction efficiency for extraction from the organic light-emitting elements 10R, 10G and 10B. The optical component 20 has a shielding film 22 serving as a black matrix on the surface of a transparent substrate 21, and an optical functional element 23 is provided in a part other than this shielding film 22. On the top surface of the optical functional element 23, a color filter 24 is formed.

The substrate 21 is made of, for example, glass, a resin substrate or a resin film made of heat resistant resin, or fused quartz.

The shielding film 22 and the color filter 24 are intended to take out the light produced in the organic light-emitting elements 10R, 10G and 10B, and absorb the external light reflected on the organic light-emitting elements 10R, 10G and 10B and the wiring therebetween, to thereby improve the contrast.

The shielding film 22 is composed of a black resin film mixed with a black coloring agent and having an optical density of 1 or more, or a thin film filter using thin-film interference. Of these, it is preferable to use the black resin film so that the formation can be carried out easily at low cost. The thin film filter has one or more laminated thin films made of metal, metal nitride or metal oxide, and attenuates the light by using the thin-film interference. As the thin film filter, specifically, there is a filter in which chrome and chromium oxide (III) ($Cr_2O_3$) are laminated alternately.

The optical functional element 23 has, for example, a truncated cone shape, and its undersurface contacts the surface of the substrate 21, and its top surface is a flat face and has an area smaller than the undersurface. The side surface of the optical functional element 23 may be, for example, a straight tapered side surface, or may be an aspherical side surface. The optical functional element 23 is made of, for example, resin such as ultraviolet curing resin or thermosetting resin, but may be made of low-melting glass. On the side surface of the optical functional element 23, a reflecting mirror film (not illustrated) made of aluminum (Al), silver (Ag), an alloy including aluminum (Al), an alloy including silver (Ag), or the like may be formed. In addition, in the space in the optical functional element 23, a filling layer (not illustrated) made of resin may be formed.

Figure 4:
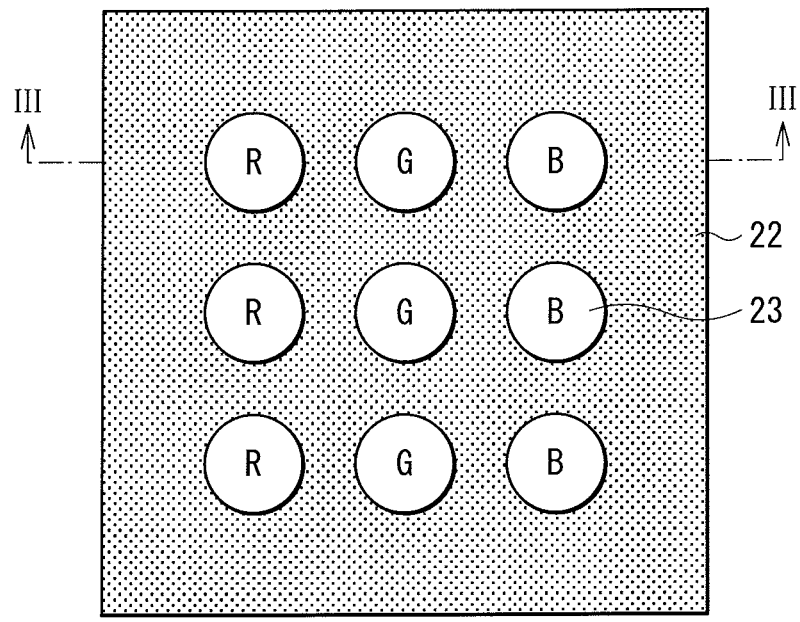
FIG. 4 is a plan view illustrating a configuration of an optical component illustrated in FIG. 3 when viewed from an optical functional element side.
Figure 5:
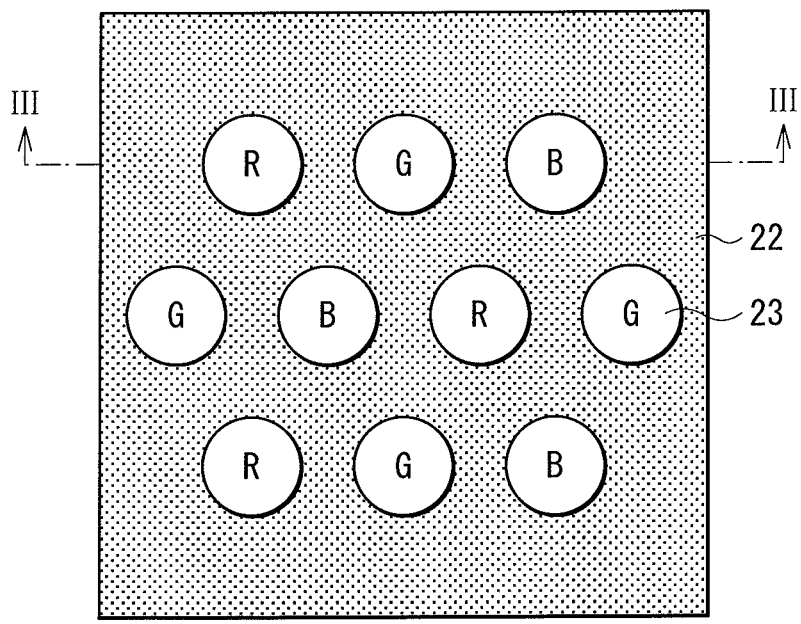
FIG. 5 is a plan view illustrating a modification of FIG. 4.

FIG. 4 and FIG. 5 illustrate plane configurations when the optical component 20 illustrated in FIG. 3 is viewed from the optical functional element 23 side. The shielding film 22 is formed on the surface of the substrate 21, in the shape of a lattice illustrated in FIG. 4, or in the shape of a mesh illustrated in FIG. 5. The optical functional element 23 is formed in the lattice or the mesh of the shielding film 22, and the planar shape of the undersurface of the optical functional element 23 is the same as the planar shape of the lattice or the mesh of the shielding film 22. This makes it possible to prevent the external-light reflection and increase the light extraction efficiency, in this optical component 20 and the display device.

The color filter 24 is formed in the top surface of the optical functional element 23. The color filter 24 has a red filter 24R, a green filter 24G and a blue filter 24B, and are located sequentially corresponding to the organic light-emitting elements 10R, 10G and 10B. Each of the red filter 24R, the green filter 24G and the blue filter 24B is rectangular and formed without a gap. The red filter 24R, the green filter 24G and the blue filter 24B are each made of resin mixed with a pigment, is adjusted so that by selecting the pigment, the light transmittance in the wavelength range of the targeted red, green, or blue becomes high, while the light transmittance in other wavelength ranges becomes low.

This display device can be produced as follows, for example.

Figure 6:
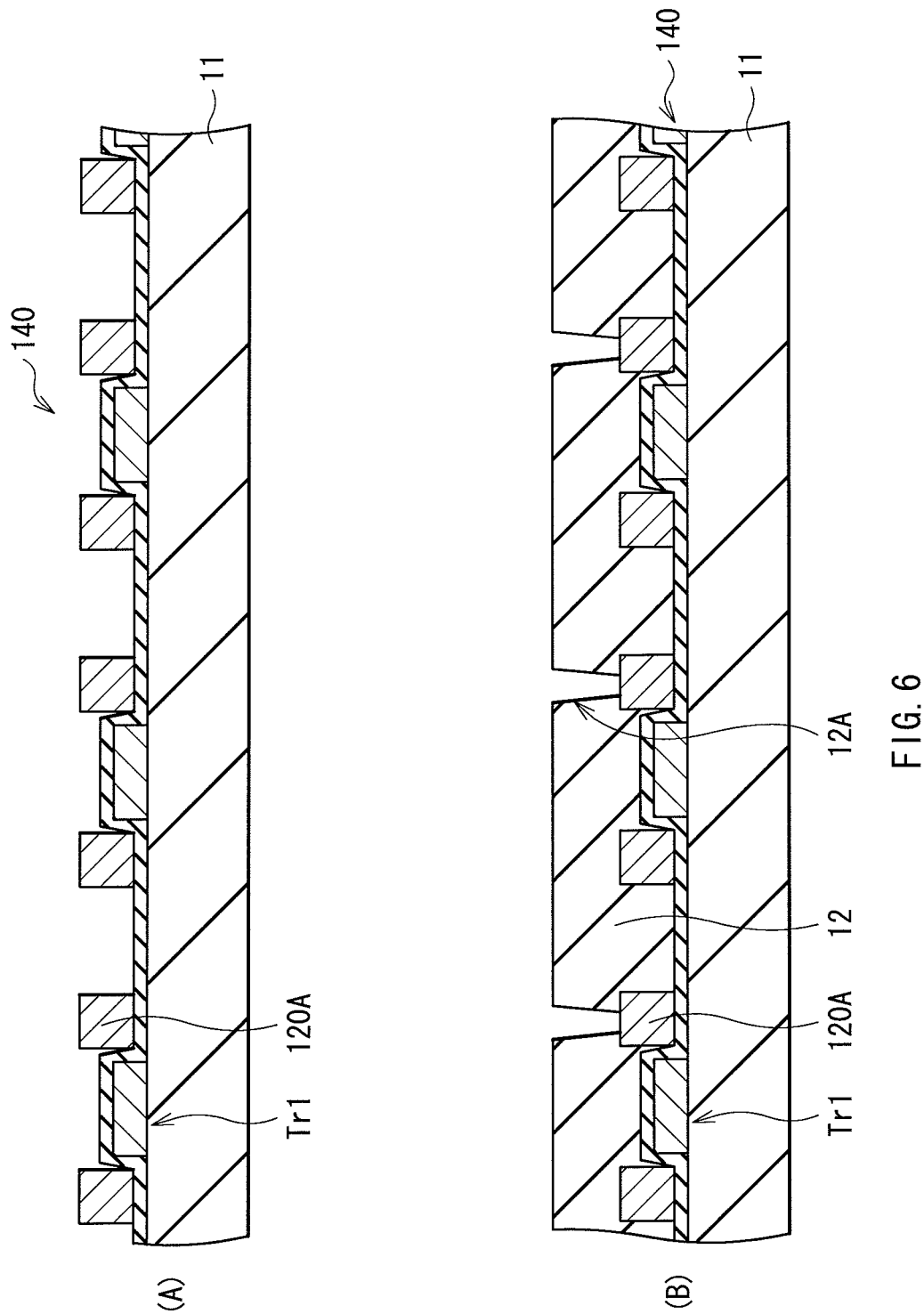
FIG. 6 is a cross-sectional view illustrating a method of manufacturing the display device illustrated in FIG. 3 in process order.

FIG. 6 through FIG. 11 illustrate a method of manufacturing this display device in process order. At first, as illustrated in FIG. 6 (A), the pixel driving circuit 140 made of the above-described material is formed on the drive board 11.

Next, as illustrated in FIG. 6 (B), the planarizing layer 12 made of, for example, photosensitive polyimide, is applied to and thereby formed on the entire surface of the drive board 11, by spin coating, for example, and patterned to have a predetermined shape by being subjected to exposure and development processing, and subjected to firing after the connection aperture 12A is formed.

Figure 7:
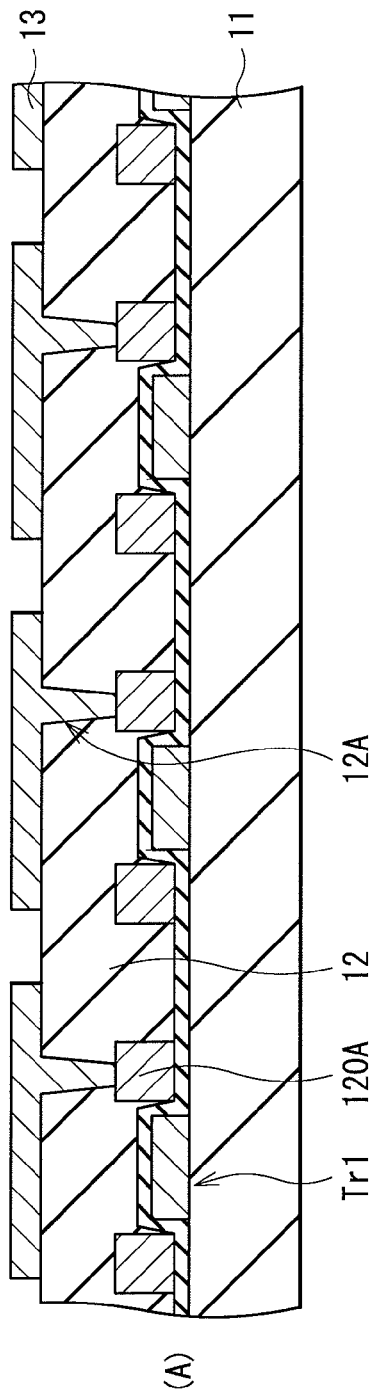
FIG. 7 is a cross-sectional view illustrating a process subsequent to FIG. 6.
Figure 7:
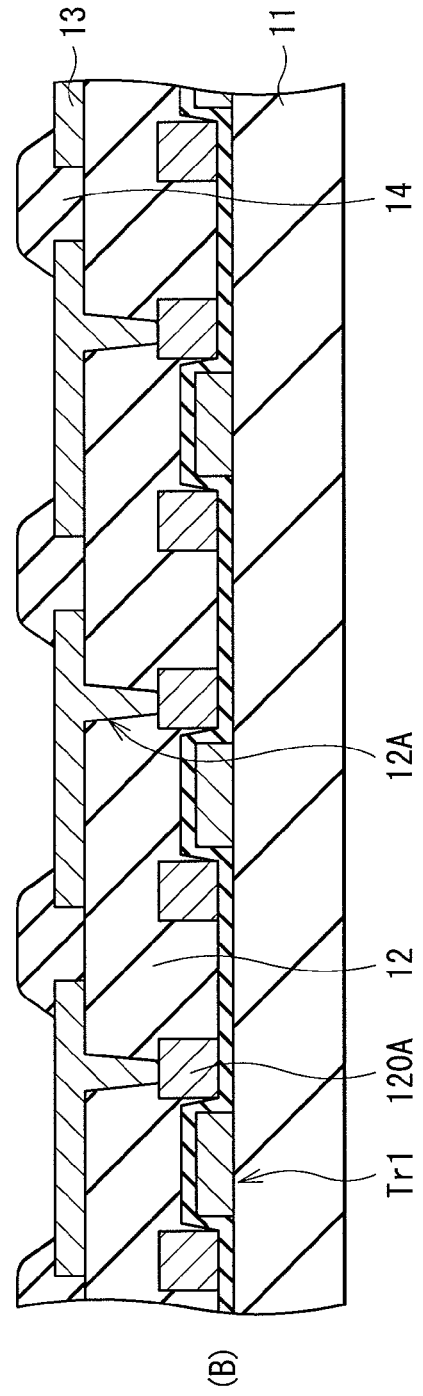

Subsequently, as illustrated in FIG. 7 (A), on the planarizing layer 12, the first electrode 13 having the above-described thickness and made of the above-described material is formed by, for example, sputtering and then, patterned to have a predetermined shape by, for example, a photolithography technique and etching. As a result, on the planarizing layer 12, the plural first electrodes 13 are formed.

Subsequently, as illustrated in FIG. 7 (B), photosensitive resin is applied to the entire surface of the drive board 11, and the opening section is formed by exposure and development processing and then, firing is carried out so that the insulating film 14 is formed.

Figure 8:
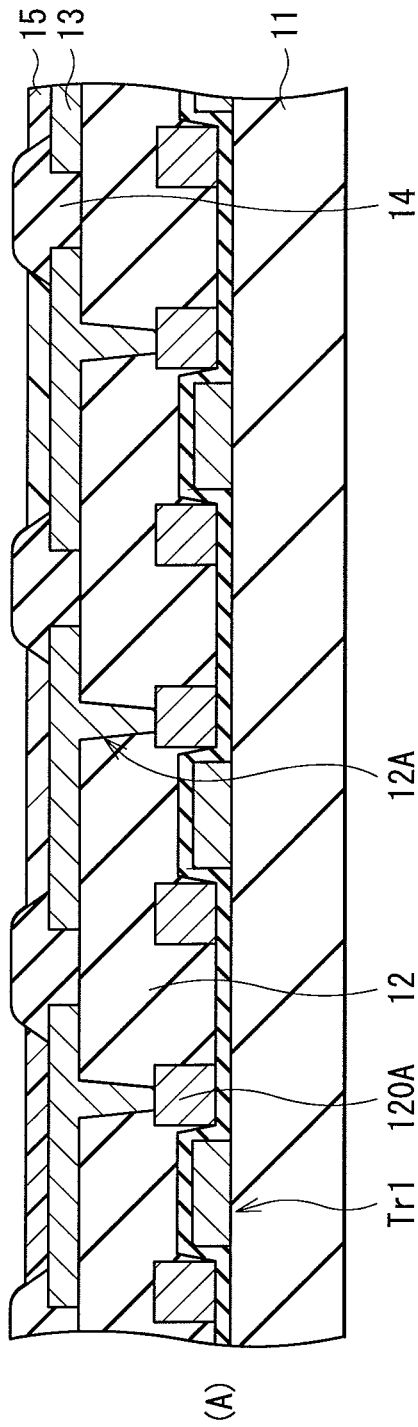
FIG. 8 is a cross-sectional view illustrating a process subsequent to FIG. 7.
Figure 8:
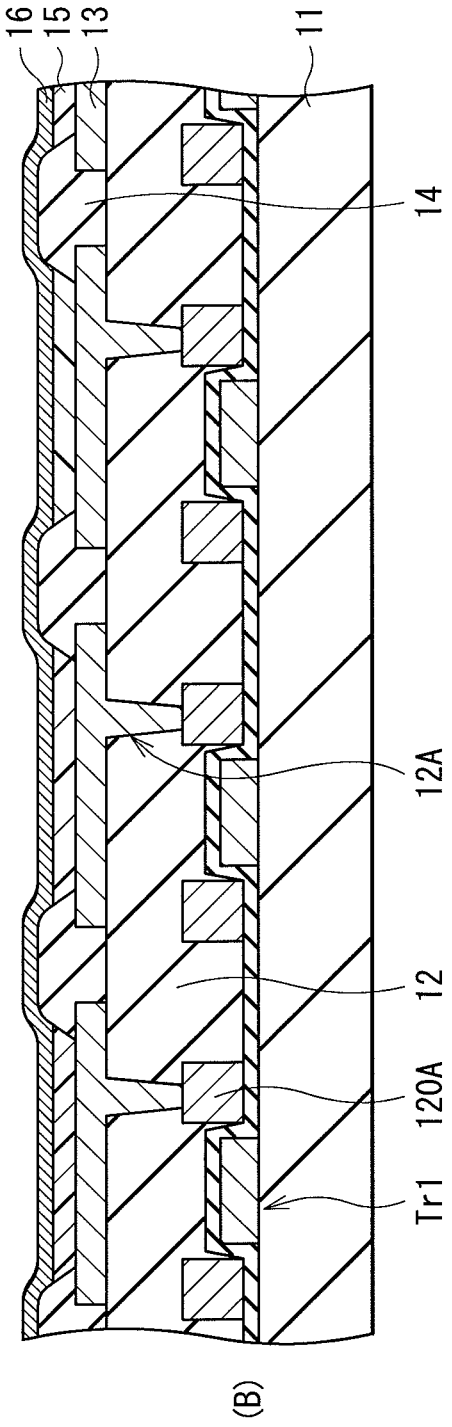

Subsequently, as illustrated in FIG. 8 (A), by, for example, vacuum deposition, the hole injection layer, the hole transport layer, the light-emitting layer, and the electron transport layer of the organic light-emitting element 10R having the above-described thicknesses and made of the above-described materials are formed sequentially as films so that the organic layer 15 of the organic light-emitting element 10R is formed. And then, in a manner similar to the organic layer 15 of the organic light-emitting element 10R, as illustrated in FIG. 8 (A), the hole injection layer, the hole transport layer, the light-emitting layer, and the electron transport layer of the organic light-emitting element 10G having the above-described thicknesses and made of the above-described materials are formed sequentially as films so that the organic layer 15 of the organic light-emitting element 10G is formed. And then, in a manner similar to the organic layer 15 of the organic light-emitting element 10R, as illustrated in FIG. 8 (A), the hole injection layer, the hole transport layer, the light-emitting layer, and the electron transport layer of the organic light-emitting element 10B having the above-described thicknesses and made of the above-described materials are formed sequentially as films so that the organic layer 15 of the organic light-emitting element 10B is formed.

After the organic layers 15 of the organic light-emitting elements 10R, 10G and 10B are formed, as illustrated in FIG. 8 (B), over the entire surface of the drive board 11, the second electrode 16 having the above-described thickness and made of the above-described material is formed by, for example, evaporation method. In this way, the organic light-emitting elements 10R, 10G and 10B illustrated in FIG. 1 and FIG. 3 are formed.

Figure 9:
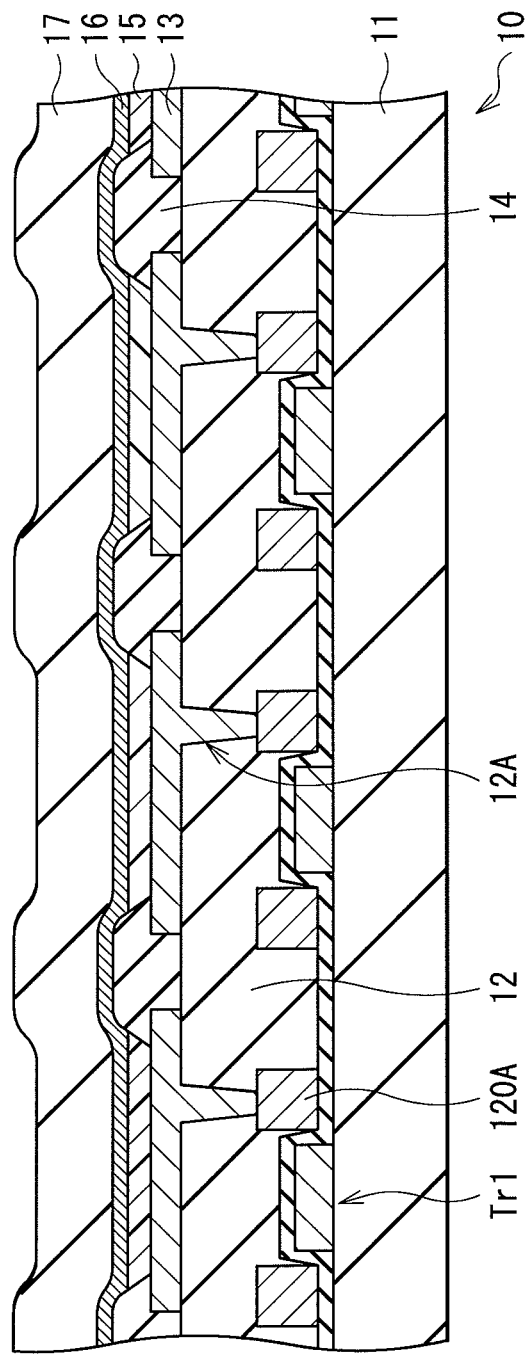
FIG. 9 is a cross-sectional view illustrating a process subsequent to FIG. 8.

Next, as illustrated in FIG. 9, the protective film 17 having the above-described thickness and made of the above-described material is formed on the second electrode 16. In this way, the light-emitting panel 10 illustrated in FIG. 3 is formed.

Figure 10:
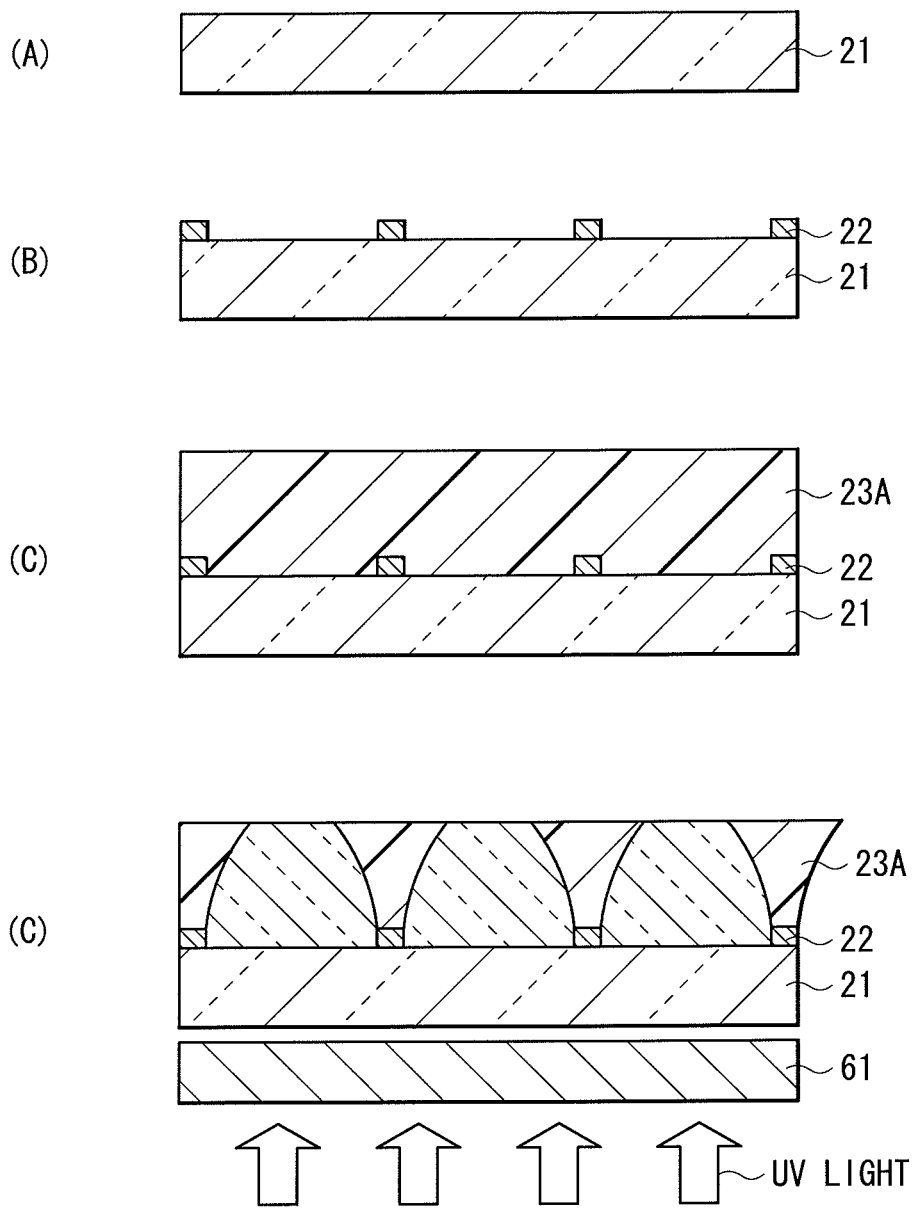
FIG. 10 is a cross-sectional view illustrating a process subsequent to FIG. 9.

Further, the optical component 20 is formed. At first, as illustrated in FIG. 10 (A), the transparent substrate 21 made of the above-described material is prepared, and as illustrated in FIG. 10 (B), the shielding film 22 made of the above-described material is formed on the surface of this substrate 21, and patterned to have a predetermined lattice or mesh shape. At the time, on the substrate 21, it is desirable to form beforehand a positioning mark to be used for alignment in a post process.

Subsequently, as illustrated in FIG. 10 (C), after a resist (for example, a permanent resist capable of being available for optical use after hardening, such as "SU-8" made by MicroChem Corp.) is applied to the entire surface of the substrate 21 by using spray coating or the like, pre-baking is performed at a constant temperature so that a resist film 23A having a thickness of 50 µm to 150 µm is formed.

Subsequently, as illustrated in FIG. 10 (D), by using the shielding film 22 as a mask, the resist film 23A is irradiated with ultraviolet light UV via a diffuser 61 from the back side of the substrate 21. The irradiation of the ultraviolet light UV may be performed for the entire surface at a time, or an exposure device with a scanning function may be used. Incidentally, reflection and transmission occurs in the color filter 24 with respect to the ultraviolet light UV serving as an exposure light source, which affects exposure sensitivity, and therefore, it is desirable to form only the shielding film 22 on the substrate 21.

Figure 11:
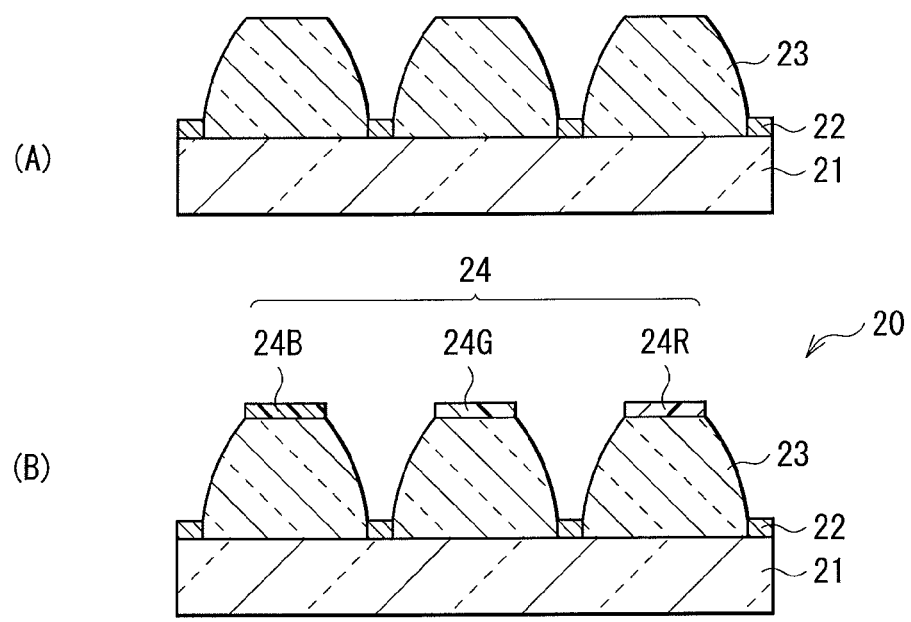
FIG. 11 is a cross-sectional view illustrating a process subsequent to FIG. 10.

Subsequently, by development, as illustrated in FIG. 11 (A), in the lattice or the mesh of the shielding film 22, the optical functional element 23 shaped to have a parabolic curved surface is formed. Here, the resist film 23A is irradiated with the ultraviolet light UV from the back side of the substrate 21 by using the shielding film 22 as the mask and therefore, the planar shape of the undersurface of the optical functional element 23 is the same as the planar shape of the lattice or the mesh of the shielding film 22, and a positioning error between the optical functional element 23 and the shielding film 22 can be made extremely small (basically, zero at the minimum).

Subsequently, after the reflecting mirror film and the filling layer (neither of them illustrated) are formed as needed, as illustrated in FIG. 11 (B), the material of the red filter 24R is applied to the surface of the optical functional element 23 by spin coating or the like, and patterned by a photolithography technique and subjected to firing, so that the red filter 24R is formed. And then, like the red filter 24R, the blue filter 24B and the green filter 24G are sequentially formed.

After the optical component 20 and the light-emitting panel 10 are formed in this way, the adhesive layer 30 is formed on the protective film 17 of the light-emitting panel 10, and by directing end surfaces of the optical functional element 23 toward the organic light-emitting elements 10R, 10G and 10B respectively, the optical component 20 is disposed on the light extraction side of the light-emitting panel 10 (the second electrode 16 side), and affixed by the adhesive layer 30. This completes the display device illustrated in FIG. 1 to FIG. 3.

In this display device, the scanning signal is supplied through the gate electrode of the write transistor Tr2 from the scanning-line driving circuit 130 for each pixel, and the image signal from the signal-line driving circuit 120 through the write transistor Tr2 is retained by the retention capacity Cs. In other words, the drive transistor Tr1 is subjected to on-off control according to the signal retained by this retention capacity Cs, so that a driving current Id is injected into each of the organic light-emitting elements 10R, 10G and 10B and therefore the recombination of positive hole and electron takes place to cause the emission of light. This light passes through the second electrode 16, the color filter 24, the optical functional element 23 and the substrate 21, and is taken out.

Specifically, the light produced in the organic light-emitting elements 10R, 10G and 10B enters the end surface of the optical functional element 23, and is reflected off the reflecting mirror film (not illustrated) formed on the side surface of the optical functional element 23 and is taken out to the outside. Therefore, the light extraction efficiency increases, and the luminance improves. Here, the planar shape of the undersurface of the optical functional element 23 is the same as the planar shape of the lattice or the mesh of the shielding film 22 and thus, the positioning error between the optical functional element 23 and the shielding film 22 is extremely small (basically, zero at the minimum). Therefore, the positional accuracy between the optical functional element 23 and the organic light-emitting elements 10R, 10G and 10B is high, making it possible to further improve the front luminance. In addition, the external light entering from the substrate 21 side is absorbed by the shielding film 22, and the external-light reflection is prevented.

In this way, in the method of manufacturing the display device of the present example embodiment, in the process of producing the optical component 20, the resist film 23A is irradiated with the ultraviolet light UV from the back side of the substrate 21 by using the shielding film 22 as the mask and thus, the positioning error between the optical functional element 23 and the shielding film 22 can be made extremely small.

In addition, in the display device of the present example embodiment, in the optical component 20, the planar shape of the undersurface of the optical functional element 23 is made to be the same as the planar shape of the lattice or the mesh of the shielding film 22 and thus, the positioning error between the optical functional element 23 and the shielding film 22 can be made extremely small. Therefore, by configuring the display device by using this optical component 20, the positional accuracy between the optical functional element 23 and the organic light-emitting elements 10R, 10G and 10B can be increased, making it possible to improve the light extraction efficiency.

Incidentally, the example embodiment has been described above for the case in which the color filter 24 is formed on the top surface of the optical functional element 23, but the present example embodiment is applicable to a CF-less configuration in which the color filter 24 is not provided.

Second Example Embodiment

Figure 12:
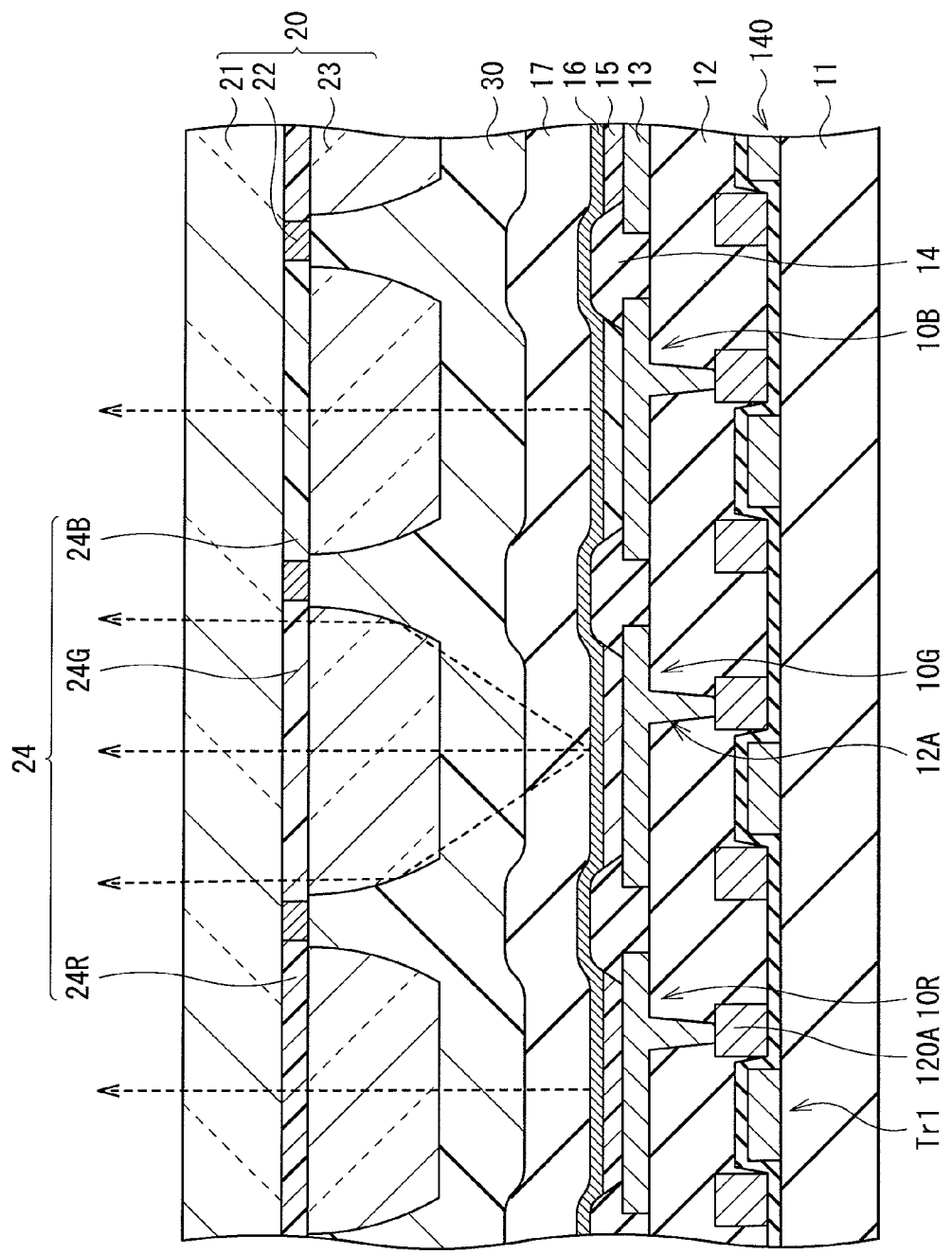
FIG. 12 is a diagram illustrating a configuration of a display device according to a second example embodiment of the present disclosure.

FIG. 12 illustrates a cross-sectional structure of a display device according to a second example embodiment of the present disclosure. This display device has the same structure as the first example embodiment described above except that the structure and manufacturing method of the optical component 20 is different. Therefore, the same elements are provided with the same signs and will be described.

The light-emitting panel 10 and the adhesive layer 30 are configured in a manner similar to the first example embodiment.

The substrate 21 and the shielding film 22 of the optical component 20 are configured in a manner similar to the first example embodiment. The color filter 24 is formed in the lattice or the mesh of the shielding film 22, and the optical functional element 23 is formed on the color filter 24. Except for this point, this display device is configured in a manner similar to the first example embodiment.

This display device can be produced as follows, for example.

At first, in a manner similar to the first example embodiment, by the processes illustrated in FIG. 6 to FIG. 9, the organic light-emitting elements 10R, 10G and 10B are formed on the drive board 11 and thereby the light-emitting panel 10 is formed.

Figure 13:
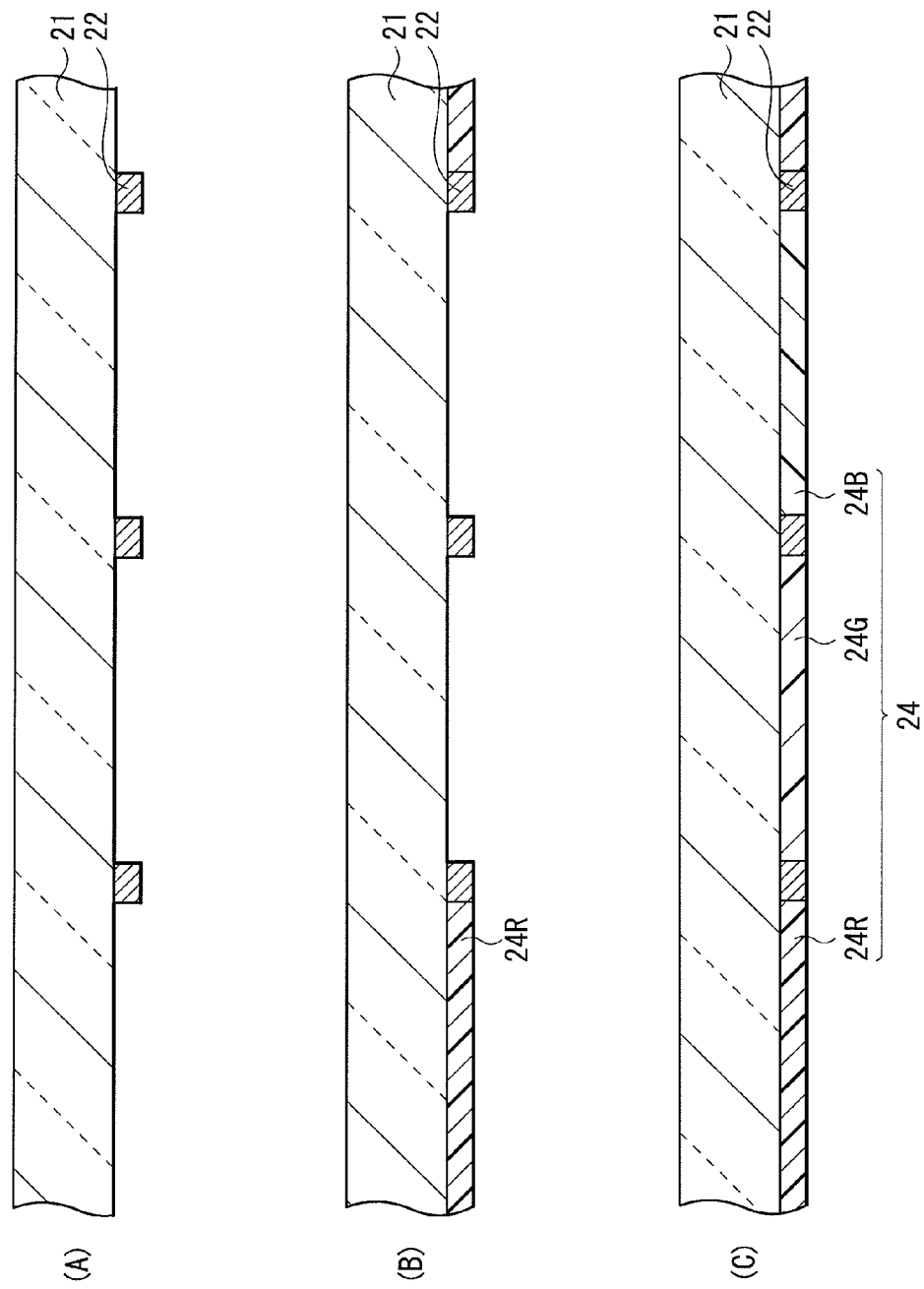
FIG. 13 is a cross-sectional view illustrating a method of manufacturing the display device illustrated in FIG. 12 in process order.

Further, the optical component 20 is formed. At first, as illustrated in FIG. 13 (A), the shielding film 22 made of the above-described material is formed on the surface of the substrate 21 made of the above-described material, and patterned to have a predetermined lattice or mesh shape. Subsequently, as illustrated in FIG. 13 (B), the material of the red filter 24R is applied on the substrate 21 by spin coating or the like, and patterned by a photolithography technique and subjected to firing, so that the red filter 24R is formed in the lattice or the mesh of the shielding film 22. In the patterning, an edge of the red filter 24R may touch the shielding film 22. Subsequently, as illustrated in FIG. 13 (C), in a manner similar to the red filter 24R, the blue filter 24B and the green filter 24G are formed in the lattice or the mesh of the shielding film 22 sequentially. As a result, the shielding film 22 and the color filter 24 are formed on the surface of the substrate 21.

Figure 14:
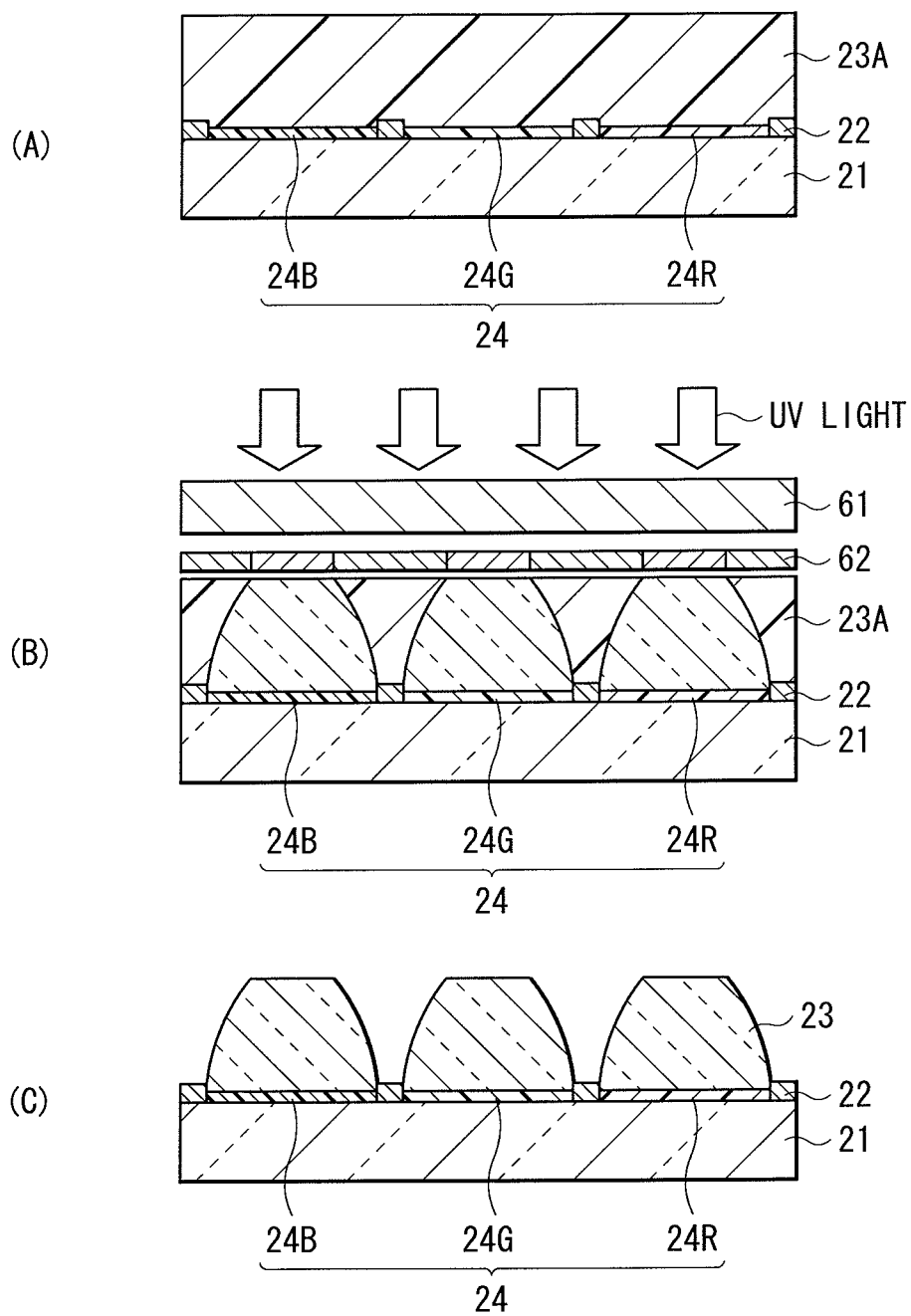
FIG. 14 is a cross-sectional view illustrating a process subsequent to FIG. 13.

Subsequently, as illustrated in FIG. 14 (A), after a resist (for example, a permanent resist capable of being available for optical use after hardening, such as "SU-8" made by MicroChem Corp.) is applied to the entire surface of the substrate 21 by using spray coating or the like, pre-baking is performed at a constant temperature so that the resist film 23A having a thickness of 50 μm to 150 μm is formed.

Subsequently, as illustrated in FIG. 14 (B), the ultraviolet light UV is irradiated from the front surface side of the substrate 21, via the diffuser 61 and a mask 62. At the time, the substrate 21 and the mask 62 are precisely positioned and exposed. Subsequently, by performing development, as illustrated in FIG. 14 (C), the optical component 20 having the optical functional element 23 shaped to have a parabolic curved surface is formed on the color filter 24. Here, the resist film 23A is formed on the substrate 21 where the shielding film 22 and the color filter 24 are formed, this resist film 23A is irradiated with the ultraviolet light UV via the mask 62, and the optical functional element 23 is formed by the development and thus, it is possible to increase the positional accuracy between the optical functional element 23 and the shielding film 22 as well as the color filter 24.

On the other hand, previously, a sealing panel in which a color filter and the like were formed, and the optical component were separately formed and it was necessary to perform their alignment and affixation for the entire surface perfectly with accuracy without causing displacement, and a highly difficult alignment process was required repeatedly. In addition, in a process of producing an optical component in the past, an optical functional element was molded by using a die for a resin sheet and a film and thus, an influence on the optical property caused by a minute distortion at the time of molding for a large area and expansion and shrinkage due to heat and humidity in a sheet alone were apt to occur. Therefore, a pitch error in the individual optical functional elements was easily caused and thus, affixation to an optically-transparent substrate such as glass was necessary, which required a process of highly precise alignment adjustment and bonding, here as well. In contrast, in the present example embodiment, the optical functional element 23 can be directly formed on the substrate 21, and it is possible to eliminate the necessity for the alignment and bonding between the optical functional element and the substrate in the past.

After the optical component 20 and the light-emitting panel 10 are formed in this way, the adhesive layer 30 is formed on the protective film 17 of the light-emitting panel 10, and by directing the end surfaces of the optical functional element 23 toward the organic light-emitting elements 10R, 10G and 10B respectively, the optical component 20 is disposed on the light extraction side of the light-emitting panel 10 (the second electrode 16 side), and affixed by the adhesive layer 30. This completes the display device illustrated in FIG. 10.

In this display device, in a manner similar to the first example embodiment, the light is produced in the organic light-emitting elements 10R, 10G and 10B, and this light enters the optical functional element 23 from the end surface thereof and is reflected off the reflecting mirror film (not illustrated) formed on the side surface of the optical functional element 23, and taken out to the outside. Therefore, the light extraction efficiency increases, and the luminance improves. Here, the resist film 23A is formed on the substrate 21 where the shielding film 22 and the color filter 24 are formed, and this resist film 23A is irradiated with the ultraviolet light UV via the mask 62 and subjected to development, so that the optical functional element 23 is formed, and thus, the positional accuracy between the optical functional element 23 and the shielding film 22 as well as the color filter 24 is high. Therefore, the front luminance improves.

In this way, in the method of manufacturing the display device of the present example embodiment, in the process of producing the optical component 20, the resist film 23A is formed on the substrate 21 where the shielding film 22 and the color filter 24 are formed, and this resist film 23A is irradiated with the ultraviolet light UV via the mask 62 and subjected to development, so that the optical functional element 23 is formed, and thus, the positional accuracy between the optical functional element 23 and the shielding film 22 as well as the color filter 24 can be increased. Therefore, the front luminance can be improved.

MODULE AND APPLICATION EXAMPLES

In the following, application examples of the display device described in the above example embodiments will be described. The display device of the example embodiments can be applied to display devices of electronic apparatuses in all fields, which display externally-input video signals or internally-generated video signals as still or moving images, such as television receivers, digital cameras, laptop computers, portable terminal devices such as portable telephones, and video cameras.

(Module)

Figure 15:
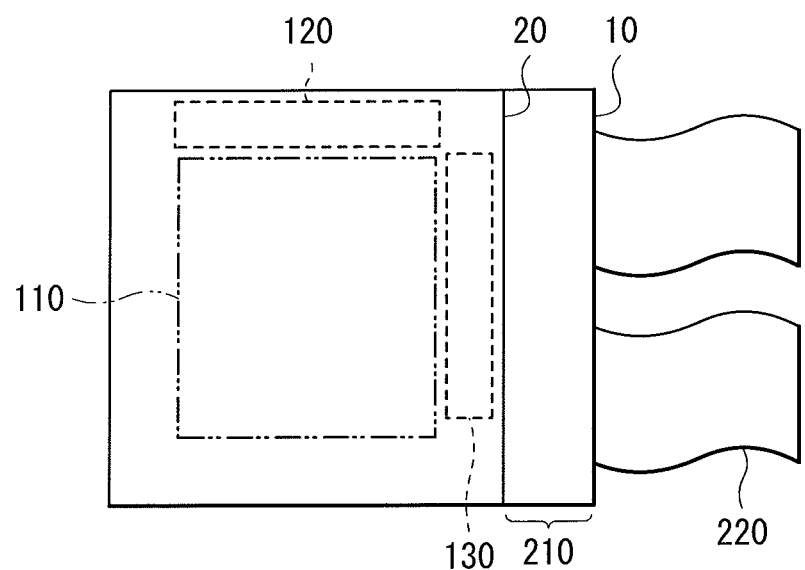
FIG. 15 is a plan view illustrating a schematic structure of a module including the display devices of the example embodiments described above.

The display device of the example embodiments described above is, for example, incorporated into various kinds of electronic apparatus such as application examples 1 to 5 to be described later, as a module as illustrated in FIG. 15. In this module, for example, at one side of a board 11, a region 210 exposed from the optical component 20 and the adhesive layer 30 is provided, and to this exposed region 210 for driving, wiring of the signal-line drive circuit 120 and the scanning-line drive circuit 130 is extended and therefore an external connection terminal (not illustrated) is formed. In the external connection terminal, a flexible printed circuit board (FPC: Flexible Printed Circuit) 220 for input and output of the signals may be provided.

Application Example 1

Figure 16:
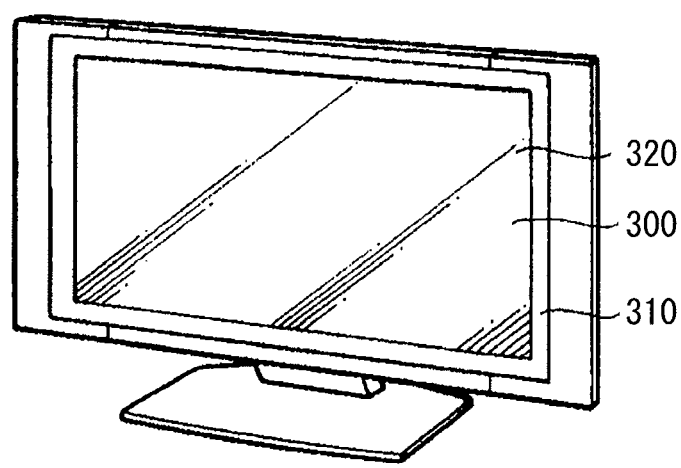
FIG. 16 is a perspective view illustrating an external appearance of an application example 1 of the display devices of the example embodiments described above.

FIG. 16 illustrates an external view of a television receiver to which the display device of the above-described example embodiments is applied. This television receiver has, for example, a video display screen section 300 including a front panel 310 and a filter glass 320, and this video display screen section 300 is constructed of the display device according to each of the above-described example embodiments.

Application Example 2

Figure 17A:
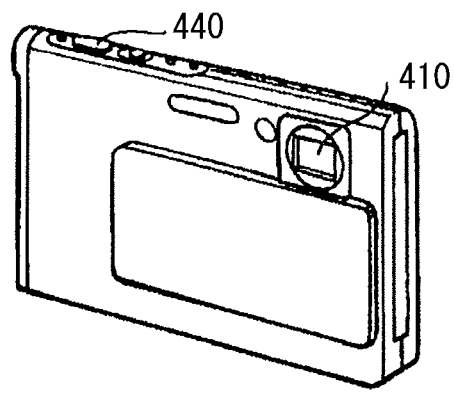
FIG. 17 is a diagram in which (A) is a perspective view illustrating an external appearance of an application example 2 viewed from a front side, and (B) is a perspective view illustrating an external appearance viewed from a rear side.
Figure 17B:
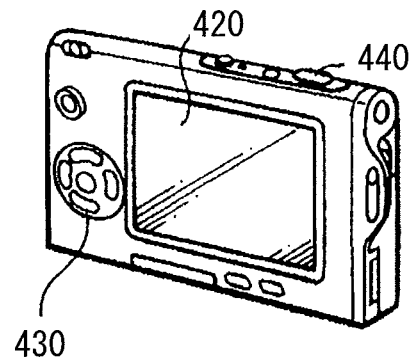

FIG. 17 illustrates external views of a digital camera to which the display device of the above-described example embodiments is applied. This digital camera includes, for example, a flash emitting section 410, a display section 420, a menu switch 430, and a shutter button 440, and the display section 420 is constructed of the display device according to each of the above-described example embodiments.

Application Example 3

Figure 18:
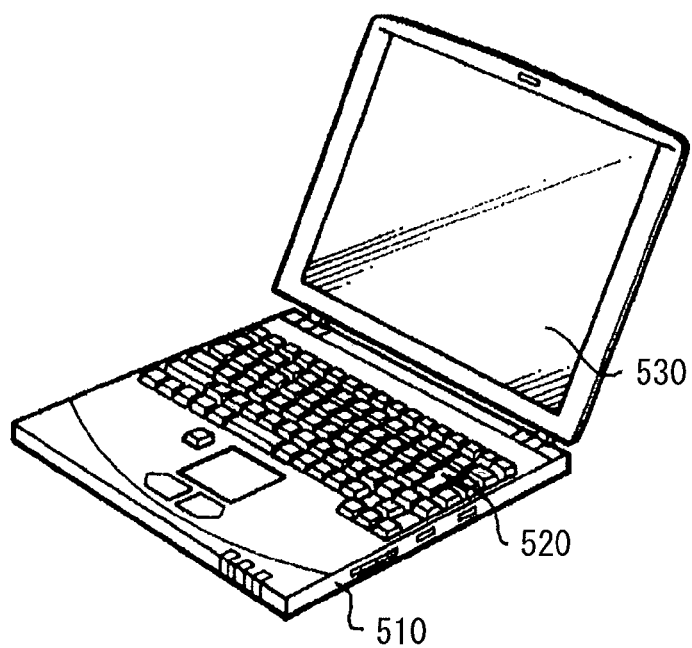
FIG. 18 is a perspective view illustrating an external appearance of an application example 3.

FIG. 18 illustrates an external view of a laptop computer to which the display device of the above-described example embodiments is applied. This laptop computer includes, for example, a main section 510, a keyboard 520 for entering characters and the like, and a display section 530 that displays an image, and the display section 530 is constructed of the display device according to each of the above-described example embodiments.

Application Example 4

Figure 19:
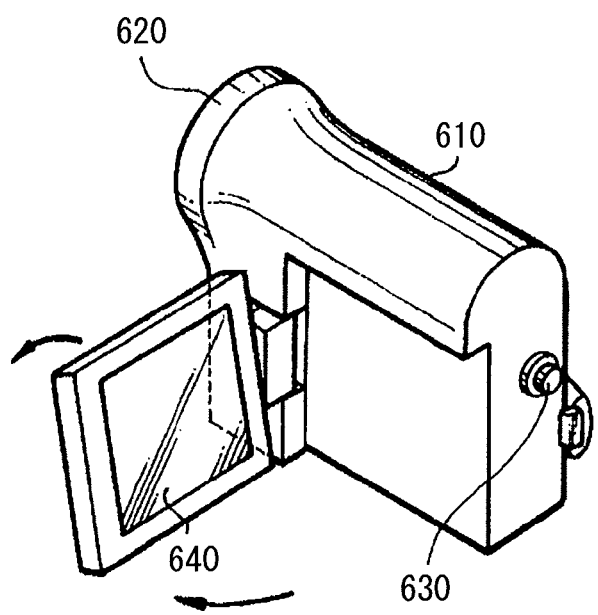
FIG. 19 is a perspective view illustrating an external appearance of an application example 4.

FIG. 19 illustrates an external view of a video camera to which the display device of the above-described example embodiments is applied. This video camera includes, for example, a main section 610, a lens 620 disposed on a front face of this main section 610 to shoot an image of a subject, a start/stop switch 630 used at the time of shooting, and a display section 640, and the display section 640 is constructed of the display device according to each of the above-described example embodiments.

Application Example 5

Figure 20:
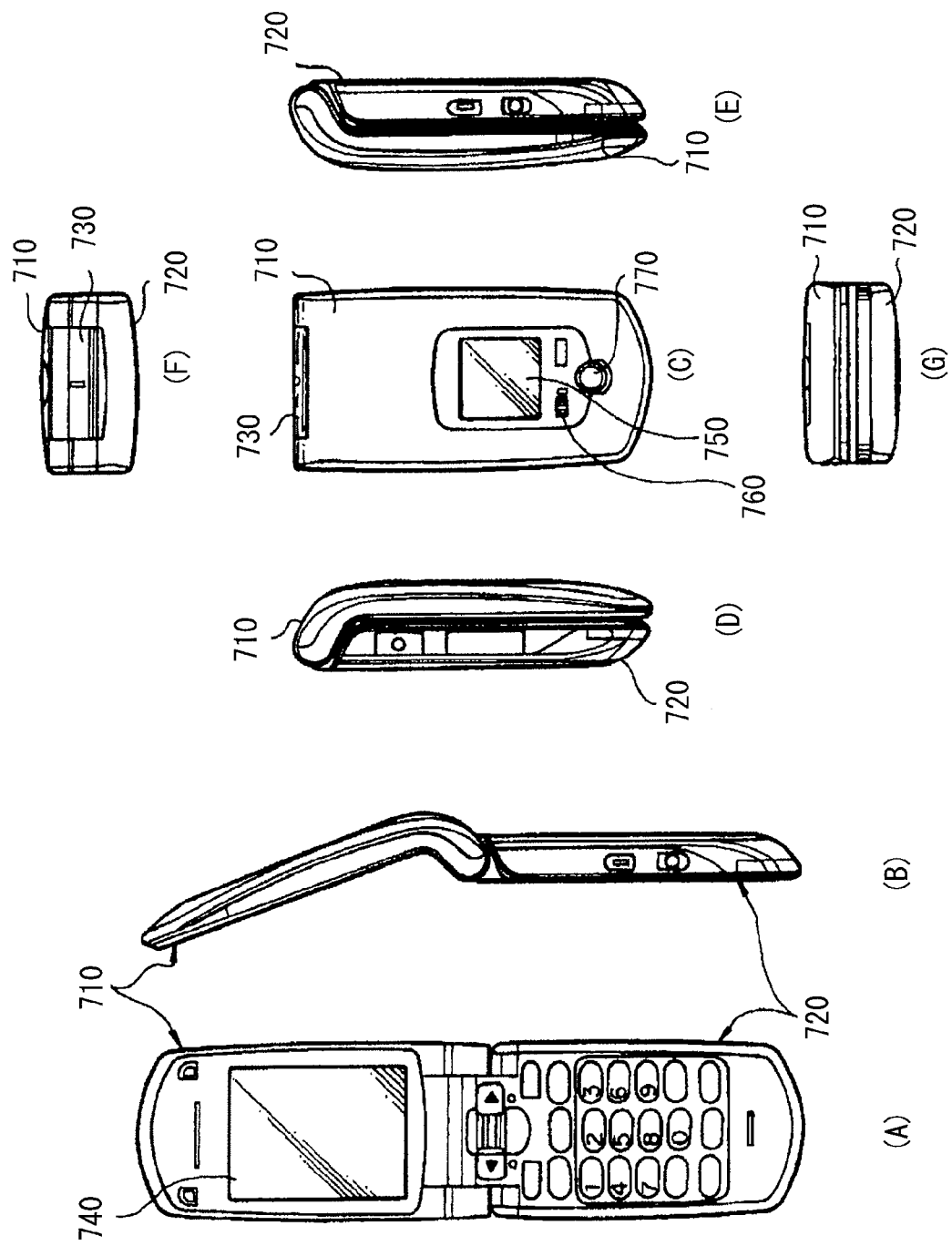
FIG. 20 is a diagram in which (A) is a front view of an application 5 in an open state, (B) is a side view thereof, (C) is a front view in a closed state, (D) is a left-side view thereof, (E) is a right-side view thereof, (F) is a top view thereof, and (G) is a bottom view thereof.

FIG. 20 illustrates external views of a portable telephone to which the display device of the above-described example embodiments is applied. This portable telephone is, for example, a device in which an upper housing 710 and a lower housing 720 are connected by a coupling section (hinge section) 730, and includes a display 740, a sub-display 750, a picture light 760, and a camera 770. The display 740 or the sub-display 750 is constructed of the display device according to each of the above-described example embodiments.

Up to this point, the present disclosure has been described by using the example embodiments, but the present disclosure is not limited to the above-described example embodiments, and may be variously modified. For example, the example embodiments have been described above for the case in which the optical component 20 is applied to the reflecting board (reflector) of the display device, but the optical component 20 can be applied to the diffuser in addition to the reflector. Further, a trapezoidal prism can be formed as the optical functional element 23.

In addition, the example embodiments have been described above for the case in which the optical functional element 23 is in the truncated cone shape, but the shape of the optical functional element 23 can be, for example, other three-dimensional shape, such as a dotted shape (including a cylindrical shape, a hemispheric shape, and an aspherical shape such as a micro lens), or a parabolic bell shape, depending on a use of the optical component 20, and is not particularly limited. In addition, the shape of the optical functional element 23 is not limited to the three-dimensional shape, and may be a two-dimensional shape, including a linear pattern with a triangle mountain-like shape such as a prism.

Further, for example, the material and the thickness of each layer or the film formation methods and the film formation conditions described in the example embodiments are not limited, and may be other material and thickness, or other film formation methods and film formation conditions.

In addition, the example embodiments have been described above by specifically using the configurations of the organic light-emitting elements 10R, 10B and 10G, but it is not necessary to provide all the layers and further, other layers may be added.

Moreover, the present disclosure can be applied to a self-light-emitting device using other self-light-emitting element such as LED (Light Emitting Diode), FED (Field Emission Display), and inorganic electroluminescent element, in addition to the organic light-emitting element.

Furthermore, the display unit of the present disclosure can also be applied to light emitting devices for purposes other than the display, such as a lighting device.

The invention claimed is:

1. A method of manufacturing an optical component, the method comprising:
   (a) foaming, on a surface of a transparent substrate, a light-shielding film shaped like a lattice or a mesh;
   (b) after forming the light-shielding film, forming a separate light-transmitting resist film all over the surface of the substrate;
   (c) irradiating the resist film with ultraviolet light from a back side of the substrate by using the light-shielding film as a mask; and
   (d) forming an optical functional element in the lattice or the mesh of the light-shielding film by developing the resist film, the optical functional element being configured to transmit light and reflect light on an inner surface of the optical functional element to thereby increase a light extraction efficiency property of the optical component.

2. The method of claim 1, which includes forming a color filter on a top surface of the optical functional element.

3. An optical component comprising:
   a transparent substrate;
   a light-shielding film formed on a surface of the substrate and shaped like a lattice or a mesh;
   an separate optical functional element formed in the lattice or the mesh of the light-shielding film, and having an undersurface whose planar shape is identical to a planar shape of the lattice or the mesh of the light-shielding film, the optical functional element being configured to transmit light and reflect light on an inner surface of the optical functional element to thereby increase a light extraction efficiency property of the optical component; and a color filter formed on a top surface of the optical functional element.

4. A method of manufacturing a display device, the method comprising:
(a) forming a light-emitting panel having a plurality of self-light-emitting elements on a substrate;
(b) forming an optical component; and
(c) providing the optical component on a light extraction side of the light-emitting panel, wherein forming the optical component includes:
(i) forming, on a surface of a transparent substrate, a light-shielding film shaped like a lattice or a mesh;
(ii) after forming the light-shielding film, forming a separate light-transmitting resist film all over the surface of the substrate;
(iii) irradiating the resist film with ultraviolet light from a back side of the substrate by using the light-shielding film as a mask; and
(iv) forming an optical functional element in the lattice or the mesh of the light-shielding film by developing the resist film, the optical functional element being configured to transmit light and reflect light on an inner surface of the optical functional element to thereby increase a light extraction efficiency property of the optical component.

5. The method of claim 4, which includes forming a color filter on a top surface of the optical functional element.

6. A display device comprising:
a light-emitting panel having a plurality of self-light-emitting elements on a substrate; and
an optical component provided on a light extraction side of the light-emitting panel, wherein the optical component includes:
(a) a transparent substrate;
(b) a light-shielding film formed on a surface of the substrate and shaped like a lattice or a mesh;
(c) a separate optical functional element formned in the lattice or the mesh of the light-shielding film, and having an undersurface whose planar shape is identical to a planar shape of the lattice or the mesh of the light-shielding film, the optical functional element being configured to transmit light and to reflect light on an inner surface of the optical functional element to thereby increase a light extraction efficiency property of the optical component; and
(d) a color filter formed on a top surface of the optical functional element.

7. A method of manufacturing an optical component, the method comprising:
(a) forming, after a light-shielding film shaped like a lattice or a mesh is formed on a surface of a transparent substrate, a color filter in the lattice or the mesh of the light-shielding film;
(b) after forming the light-shielding film and color filter, forming a separate light-transmitting resist film all over the surface of the substrate;
(c) irradiating the resist film with ultraviolet light from a front side of the substrate via a mask; and
(d) forming a separate optical functional element on the color filter by developing the resist film, the optical functional element being configured to transmit light and reflect light on an inner surface of the optical functional element to thereby increase a light extraction efficiency property of the optical component.

8. A method of manufacturing a display device, the method comprising:
(a) forming a light-emitting panel having a plurality of self-light-emitting elements on a substrate;
(b) forming an optical component; and
(c) providing the optical component on a light extraction side of the light-emitting panel, wherein forming the optical component includes:
(i) forming, after a light-shielding film shaped like a lattice or a mesh is formed on a surface of a transparent substrate, a color filter in the lattice or the mesh of the light-shielding film;
(ii) after forming the light-shielding film and color filter, forming a separate light-transmitting resist film all over the surface of the substrate;
(iii) irradiating the resist film with ultraviolet light from a front side of the substrate via a mask; and
(iv) forming a separate optical functional element on the color filter by developing the resist film, the optical functional element being configured to transmit light and reflect light on an inner surface of the optical functional element to thereby increase a light extraction efficiency property of the optical component.

9. The method of claim 1, wherein the optical functional element has a truncated cone shape.

10. The method of claim 1, wherein a side surface of the optical functional element is selected from the group consisting of a straight tapered surface and a aspherical side surface.

11. The method of claim 1, further comprising formning a reflecting mirror film on the side surface of the optical functional element.

12. The method of claim 1, further comprising developing the optical functional element by passing ultraviolet light through a diffusing layer positioned on a back side of the transparent substrate.

13. The method of claim 1, wherein a side surface of the optical functional element is a parabolic curved surface.

* * * * *